United States Patent [19]

Foster

[11] Patent Number: 5,491,412

[45] Date of Patent: Feb. 13, 1996

[54] SECURITY CIRCUIT WITH MAGNETIC PROXIMITY SENSOR HAVING A MAGNETIC SETTABLE AND ELECTRICAL RESETTABLE LATCHED OUTPUT

[75] Inventor: Johnny R. Foster, Carrollton, Tex.

[73] Assignee: Optek Technology, Inc., Carrollton, Tex.

[21] Appl. No.: 186,303

[22] Filed: Jan. 24, 1994

[51] Int. Cl.⁶ .................. G01R 33/06; G01N 27/72; H03K 17/90; H03K 19/18
[52] U.S. Cl. .................. 324/251; 324/235; 327/511; 338/32 H
[58] Field of Search ..................... 324/251, 235, 324/226, 262, 207.2, 207.26; 327/510, 511; 361/56, 88; 123/179.3, 146.5 B; 338/32 H

[56] References Cited

U.S. PATENT DOCUMENTS 4,987,512  1/1991  Mulshine .................. 361/57

*Primary Examiner*—Walter E. Snow
*Attorney, Agent, or Firm*—Ross, Clapp, Korn & Montgomery

[57] ABSTRACT

A security circuit includes a Hall-effect sensor for generating an output signal in response to a sensed variation in magnetic field strength. A supply voltage source is connected to the Hall-effect sensor. A latch circuit receives the Hall-effect sensor output signal and generates a latched output signal. The latch circuit operates between a set and a reset state. Circuitry is provided for monitoring the supply voltage source and for generating an output signal applied to the latch circuit. The latch circuit generates the latched output signal in response to the Hall-effect sensor output signal and the output signal generated by the monitoring circuit when the supply voltage is at a predetermined level. The latch circuit is reset when the supply voltage is below the predetermined level.

2 Claims, 1 Drawing Sheet

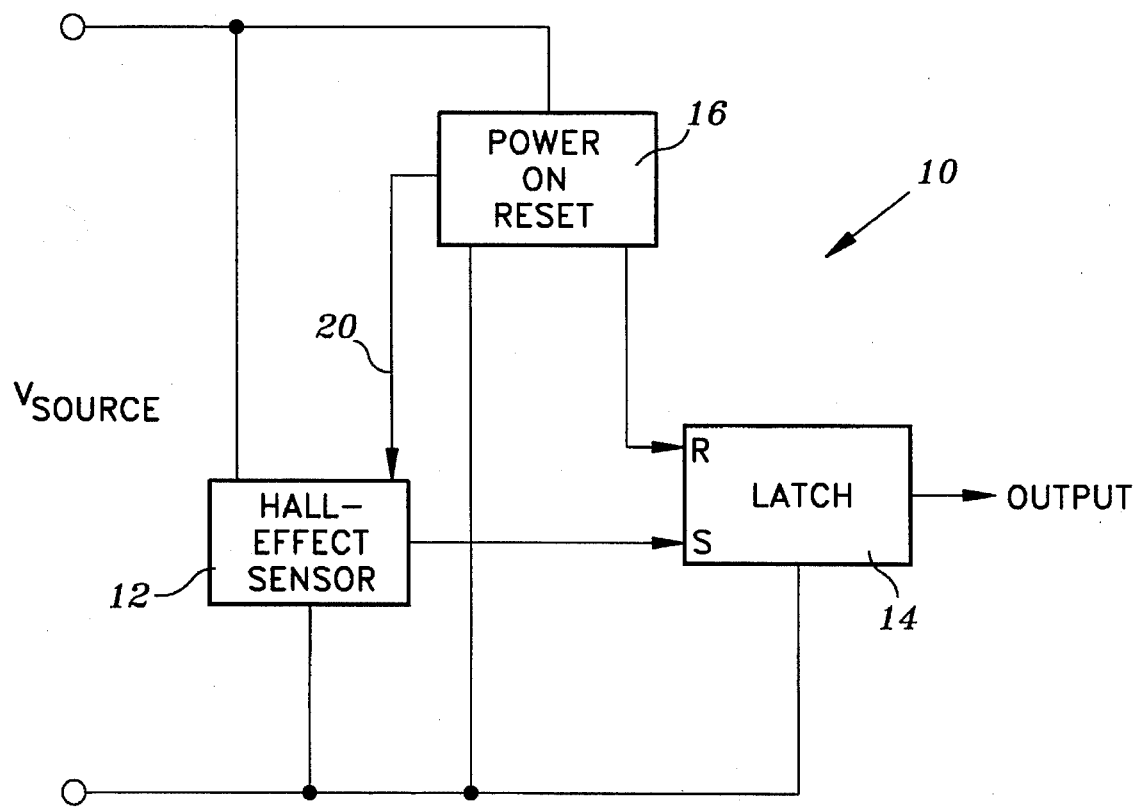

SECURITY CIRCUIT WITH MAGNETIC PROXIMITY SENSOR HAVING A MAGNETIC SETTABLE AND ELECTRICAL RESETTABLE LATCHED OUTPUT

TECHNICAL FIELD OF THE INVENTION

The present invention relates to security systems, and more particularly to a security system utilizing a Hall-effect sensor having a latched output.

BACKGROUND OF THE INVENTION

Ignition security systems for automotive applications may utilize a Hall-effect magnetic sensor in the ignition switch lock assembly to generate a specific voltage code for transmission to a microprocessor of the ignition system of the vehicle. The Hall-effect sensor may be located in the lock sleeve, and is activated by a magnet located in the lock cylinder. The magnet in the lock cylinder provides the magnetic flux necessary to turn on the Hall-effect sensor. During normal operation the magnet is rotated past the Hall-effect sensor, and the output of the Hall-effect sensor changes from a high level to a low level resulting in a set voltage at the output of the Hall-effect sensor. This output is latched and remains low when the magnet is rotated past the Hall-effect sensor and the magnetic field strength has decreased to a level below that which is necessary to turn on the Hall-effect sensor.

External simulations of a magnetic field may result in proper operation of the Hall-effect sensor to generate the required voltage code information to the ignition system microprocessor to thereby defeat the vehicle security system. Therefore, vehicle anti-tampering systems have been developed to make theft of a vehicle more difficult.

A need has thus arisen for an improved security system for a Hall-effect sensor utilized in a vehicle ignition security system.

SUMMARY OF THE INVENTION

In accordance with the present invention, a security circuit is provided. The security circuit includes a Hall-effect sensor for generating an output signal in response to a sensed variation in magnetic field strength. A supply voltage source is connected to the Hall-effect sensor. A latch circuit is provided and receives the Hall-effect sensor output signal and generates a latched output signal. The latch circuit operates between a set and a reset state. Circuitry is provided for monitoring the supply voltage source and for generating an output signal applied to the latch circuit. The latch circuit generates the latched output signal in response to the Hall-effect sensor output signal and the output signal generated by the monitoring circuit when the supply voltage is at a predetermined level. The latch circuit is reset when the supply voltage is below the predetermined level.

BRIEF DESCRIPTION OF THE DRAWINGS

For a more complete understanding of the present invention and for further advantages thereof, reference is now made to the following Description of the Preferred Embodiments taken in conjunction with the accompanying Drawing which is a block diagram of the present security circuit.

DESCRIPTION OF THE PREFERRED EMBODIMENTS

Referring to the Figure, a block diagram of the present security circuit is illustrated, and is generally identified by the numeral 10. Security circuit 10 is utilized with a Hall-effect sensor 12. Hall-effect sensor 12 may comprise, for example, a Sprague Type 3075, or equivalent which generates a latched output in response to a variation in magnetic field strength. A voltage source is applied to Hall-effect sensor 12.

The output of Hall-effect sensor 12 is applied to a latch circuit 14 which generates an output which is applied to the vehicle ignition security system. A power on reset circuit 16 monitors the level of the voltage applied to Hall-effect sensor 12. Power on reset circuit 16 generates an input to latch 14. An important aspect of the present invention is that latch 14 can only be reset by reducing the supply voltage level. This reduced supply voltage level is monitored by power on reset circuit 16. In this manner the output of latch 14 can only be generated upon the sensing of a change in the magnetic field by Hall-effect sensor 12 together with the sensing of a predetermined voltage level by power on reset circuit 16. Since the output of Hall-effect sensor 12 is latched, circuit 14 will remain latched even when the magnetic field strength decreases to a level below which is necessary to turn on Hall-effect sensor 12. However, when it is desired to reset latch circuit 14, the supply voltage must be reduced to a level below the level which set latch circuit 14. Voltage level is monitored by power on reset circuit 16.

Power on reset circuit 16 also generates an output via signal line 20 to disable Hall-effect sensor 12 when the supply voltage is below a predetermined value which would render operation of Hall-effect sensor 12 unstable.

It therefore can be seen that the present security circuit provides a security feature for a Hall-effect sensor to prevent generation of voltage code information to a microprocessor of an ignition security system of a vehicle unless certain voltage conditions are satisfied.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A security circuit for use with a voltage source comprising:

A Hall-effect sensor for generating an output signal in response to a sensed variation in the strength of a magnetic field proximate to said Hall-effect sensor and said Hall-effect sensor being adapted to be connected to a voltage source;

latch means for receiving said Hall-effect sensor output signal and for generating a latched output signal, said latch means operable between a set state and a reset state;

means for monitoring the voltage source independent of the magnetic field and for generating an output signal applied to said latch means when the voltage source is below a predetermined value; and said latch means generating said latched output signal to said set state in response to said sensor output signal and said latch means generating said latched output signal to said reset state in response to said monitoring means output signal when the voltage source is below said predetermined value.

2. The security circuit of claim 1 wherein said means for monitoring the voltage source generates a disable output signal applied to said Hall-effect sensor for disabling said Hall-effect sensor when the voltage source is below said predetermined value.

\* \* \* \* \*